United States Patent [19]
Suzuki et al.

[11] Patent Number: 5,631,784
[45] Date of Patent: May 20, 1997

[54] RECORDING AND REPRODUCING APPARATUS AND METHOD OF DUBBING FOR RECORD MEDIUM CASSETTE

[75] Inventors: Kazuyoshi Suzuki; Akihiro Uetake, both of Tokyo; Takashi Sawada, Kanagawa, all of Japan

[73] Assignee: Sony Corporation, Tokyo, Japan

[21] Appl. No.: 151,161

[22] Filed: Nov. 12, 1993

[30] Foreign Application Priority Data

Nov. 13, 1992 [JP] Japan ................................ 4-304020

[51] Int. Cl.$^6$ .................. G11B 15/18; G11B 5/86; G11B 5/008; G11B 23/02
[52] U.S. Cl. .................. 360/69; 360/15; 360/96.5; 360/132
[58] Field of Search ............... 360/15, 16, 96.5, 360/137, 61, 69, 71, 132

[56] References Cited

U.S. PATENT DOCUMENTS

| | | | |
|---|---|---|---|
| 5,055,947 | 10/1991 | Satoh | 360/137 |
| 5,187,616 | 2/1993 | Kimura et al. | 360/35.1 |
| 5,357,385 | 10/1994 | Shimizu et al. | 360/96.5 |
| 5,383,074 | 1/1995 | Biedermann et al. | 360/106 |

FOREIGN PATENT DOCUMENTS

| | | |
|---|---|---|
| 8910615 | 11/1989 | WIPO . |
| 9102355 | 2/1991 | WIPO . |

OTHER PUBLICATIONS

Patent Abstracts of Japan, vol. 14, No. 303, "Video Tape Recorder and Cassette Half Capable of Writing Index Information", abstract published Jun. 29, 1990 (Keiji et al.).

Patent Abstracts of Japan, vol. 12, No. 166, "Information Storage Medium", abstract published May 19, 1988 (Hiromichi).

WPI/Derwent, AN 81–E3974D, "Cataloguing of Video Tape Cassette Contents by Using Cassette Memory to Communicate with Microprocessor Memory in Video Equipment", Apr. 16, 1981 (Staar).

WPI/Derwent, AN 90–075919, "Magnetic Tape Recording System with Cassette Detection Allowing Orientation to be Determined Using Solid State Memory Built into Cassette with External Contact . . . ", Jun. 20, 1990 (Philips).

WPI/Derwent, AN 81–D7281D, "Electronic Identification and Data Store for Video Cassettes—Uses Memory Attached to Each Cassette to Hold Both Broadcast Data and Manually . . . ", Mar. 6, 1981 (Telediffusion).

Primary Examiner—Andrew L. Sniezek
Assistant Examiner—Regina Y. Neal
Attorney, Agent, or Firm—Jay H. Maioli

[57] ABSTRACT

A recording and reproducing apparatus includes a connection for contact with electrical terminals of a record medium cassette set in the recording and reproducing apparatus and incorporating a memory containing audio/video data and record data, such as the length of the tape in the cassette, whether it contains recorded data, or whether it is a rental video, wherein the record medium cassette does not have to be loaded in the apparatus for contact with the connection; a circuit for reading the data; and a circuit for communicating the read data to a second recording and reproducing apparatus for dubbing.

8 Claims, 14 Drawing Sheets

RECORDING AND REPRODUCING APPARATUS AND METHOD OF DUBBING FOR RECORD MEDIUM CASSETTE

BACKGROUND OF THE INVENTION

1. Field of the Invention

The present invention relates generally to record medium cassettes for use in video tape recorders (VTRs) and in video cassette recorders (VCRs) and to a recording and reproducing apparatus for such record medium cassettes and, more particularly, to record medium cassettes for recording and reproducing digital signals and apparatuses for such cassettes.

2. Description of the Background

The present invention has the purpose of providing a means for dubbing, having a function capable of communicating information recorded in a record medium cassette, which either supplies various kinds of information particular to the record medium cassette to a recording and reproducing apparatus and records various kinds of particular information or provides preset particular information to another apparatus. This invention also has the purpose of providing the pertinent recording and reproducing apparatus.

Various kinds of information particular to a tape cassette, such as a record medium cassette, for use in a VTR or a VCR, such as the length of the tape, the remaining playing time of the tape, whether the tape contains recorded information or not, whether it is a rental video, and the like, are necessary for preventing important recorded data from being destroyed, for achieving accurate recording, for preventing unfair use of the cassette, for example, by recording the number of times the cassette has been dubbed, and the like.

Accordingly, it is common practice to have such particular information written on a predetermined portion of the tape and to change record information or add new information when recording or reproduction is finished on a tape cassette loaded in a recording and reproducing apparatus, or when a tape cassette is taken out of a VTR or a VCR, to thereby store such particular information. As a means for reading such various kinds of information, a cassette having recognition holes formed in the rear face of the cassette at both left and right ends thereof is being utilized.

The recognition holes are a plurality of recognition holes c, as shown in FIG. 16, formed at specific locations in the back side b of the record medium cassette A at both left and right sides of the rear end thereof to indicate such information as the type of and properties of the record medium cassette.

Each of the plurality of recognition holes is assigned the task of indicating a particular item. For example, one recognition hole c is assigned the task of indicating the type of the magnetic tape, another recognition hole c is assigned the task of indicating the thickness of the magnetic tape, and so on.

When the record medium cassette A is loaded in a recording and reproducing apparatus, insertion pins of switches provided in the recording and reproducing apparatus corresponding to the recognition holes c read the information indicated by each recognition hole c according to the depth of insertion of the pin in the recognition hole c.

There are also such record medium cassettes which do not use such recognition holes but instead have a memory mounted thereon to store such information of the record medium cassette as the type of magnetic tape and whether or not the cassette is a recorded cassette or a rental cassette.

In the case of the record medium cassette having such a memory mounted thereon, it is possible to store record information such as the contents of the recorded video, in addition to the above described type and property of the tape, in the memory. Hence, such information as the contents of the recorded video can be quickly retrieved according to the record information.

In the copying of the contents of a pre-recorded video by dubbing, it has been impossible to copy also the data in the memory of the record medium cassette having the memory mounted thereon. While the contents stored in the memory of such a record medium cassette must correspond to the contents stored in the record medium, the contents of the memory after the dubbing have not matched the contents stored in the record medium. Accordingly, it has been necessary to rewrite the contents of the memory after the dubbing operation.

Thus, there has been a problem to be solved, that is, it has to be made possible to communicate record information in a record medium cassette to another apparatus so that, after the dubbing, the dubbed contents of the recording and the contents of the memory match each other.

OBJECTS AND SUMMARY OF THE INVENTION

In order to solve the above-described problem, an object of the present invention is to provide a recording and reproducing apparatus for a record medium cassette which has connection means to come in contact with terminals of a record medium cassette incorporating a memory, means for reading record information recorded in the memory, and communication means for communicating the record information that has been read to another apparatus.

Further, another object of the present invention is to provide a bus line through which the communication means to another apparatus performs the communication, the connection means to come in contact with terminals of a record medium cassette is disposed in a position corresponding to the position where the record medium cassette is placed in the recording and reproducing apparatus, and the means for reading record information and communicating it to another apparatus is performed through a microcomputer.

According to one aspect of the present invention, by having a plurality of terminals of the record medium cassette only in contact with the connection means of the recording and reproducing apparatus, and not having to load the record medium cassette therein, record information in the record medium cassette can be obtained and communicated to another apparatus. Therefore, the recorded contents in the record medium cassette can be quickly and simply obtained, so that retrieval and management of the record information in the record medium cassette can be performed smoothly and editing and dubbing can be performed easily.

The above and other objects, features, and advantages of the present invention will become apparent from the following detailed description of illustrative embodiments thereof to be read in conjunction with the accompanying drawings.

DETAILED DESCRIPTION OF PREFERRED EMBODIMENTS

Figure 1:
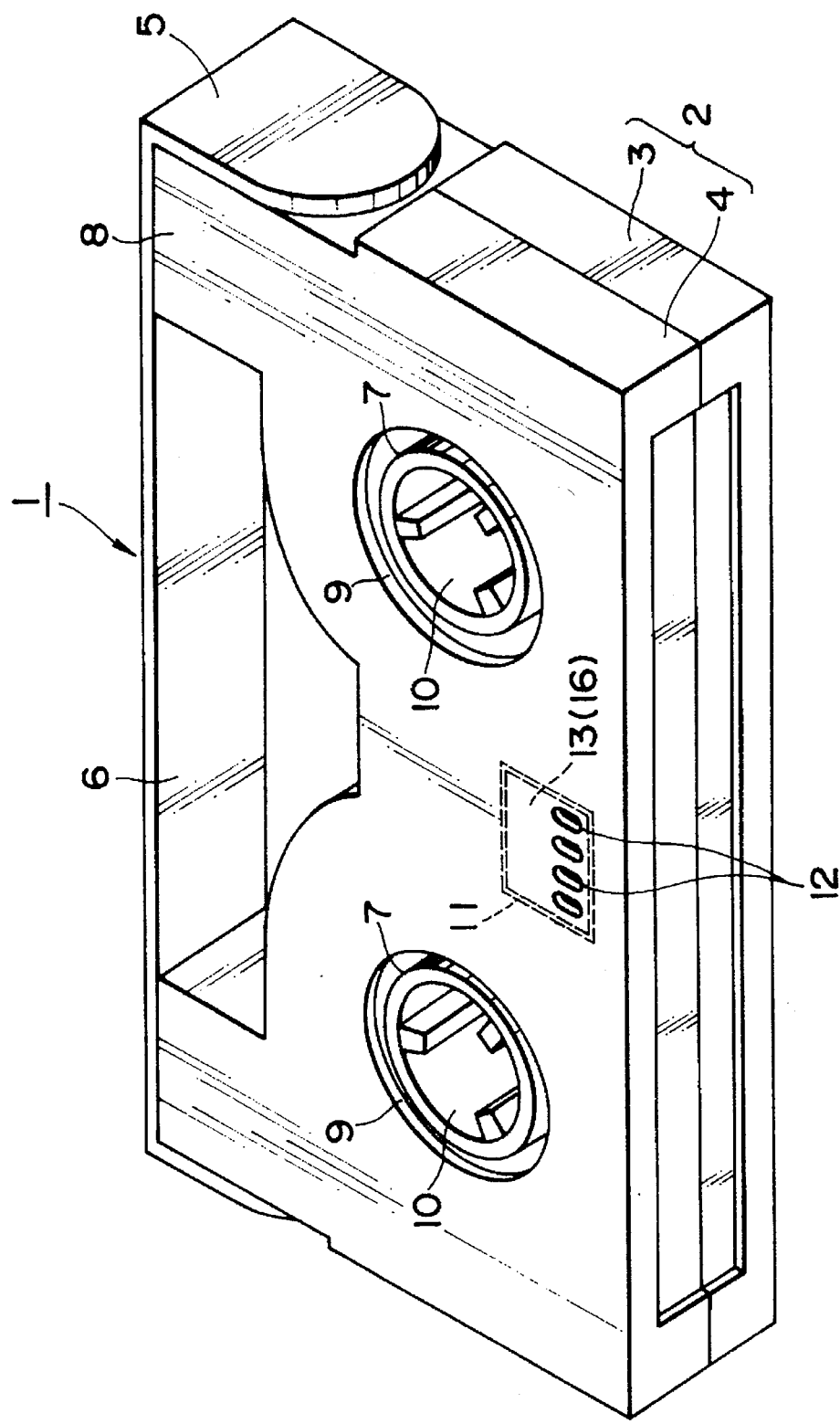
FIG. 1 is a perspective view of the rear side of a record medium cassette according to an embodiment of the present invention.

A record medium cassette 1 according to the present invention is of such construction, as shown in FIG. 1, that its cassette case 2 is formed of an upper half 3 and a lower half 4, each being of a shallow, rectangular dish form, joined together at their sides, in which an opening is formed, wherein the sides abut one another. The cassette case 2 has a lid 5 provided on the front side, and is shaped in the form of a flat box.

The lid 5 is supported in front of the cassette case 2 for rotating up and down and is for opening and closing the front side of the cassette case 2, and there is formed a mouth 6 when the lid 5 is opened.

Within the cassette case 2, there are contained tape reels 7, 7 for rotation and around which a tape is wound with each of its ends fixed to the same. The tape-reels 7, 7 are disposed to face insertion holes 9, 9 formed in the bottom wall of the cassette case 2 spaced apart to the left and right sides of the cassette case 2. The tape reels 7, 7 have reel hubs 10, 10 and the reel hubs 10, 10 extend radially into the insertion holes 9, 9.

Opposite the mouth 6 toward the rear side of the cassette case 2 on the inside of the bottom wall 8, there is formed a rectangular, shallow recess 11. In the recess 11, there are formed a plurality, four in the illustrated embodiment, of slit-like openings 12 elongated in a longitudinal direction and laterally juxtaposed.

Figure 2:
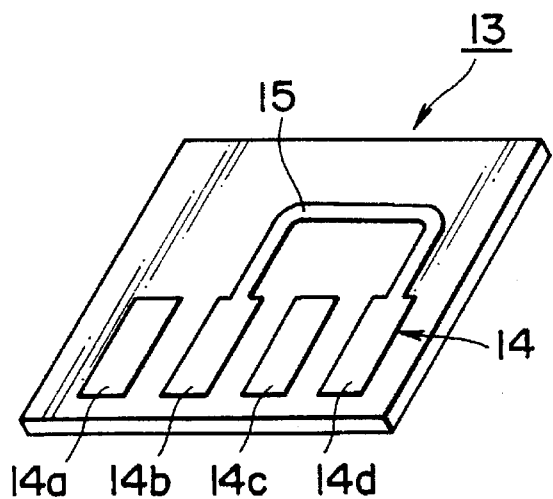
FIG. 2 is a perspective view of a printed circuit board not having an IC mounted thereon as detection means according to an embodiment of the present invention.

A printed circuit board 13, not having an IC including memory mounted thereon, to be fixed to the cassette case 2 by being fitted into the recess 11, has a group of terminals 14 and a conductor pattern 15 as shown in FIG. 2, and its planar shape is formed into a rectangle to be fitted into the recess 11 in the record medium cassette 1.

The group of terminals 14 are formed of contacts 14a, 14b, 14c, and 14d in an elongated rectangular strip form and the spacings of these contacts correspond to those of the slit-like openings 12 formed in the recess 11 of the record medium cassette 1 shown in FIG. 1. These contacts 14a, 14b, 14c, and 14d may be plated with gold for durability and reliability.

While the conductor pattern 15 may be suitably selected depending on the arrangement condition of the contacts 14a to 14d in the group of terminals 14, the contact 14b and the contact 14d are electrically connected to each other in the case of the illustrated embodiment.

Figure 3:
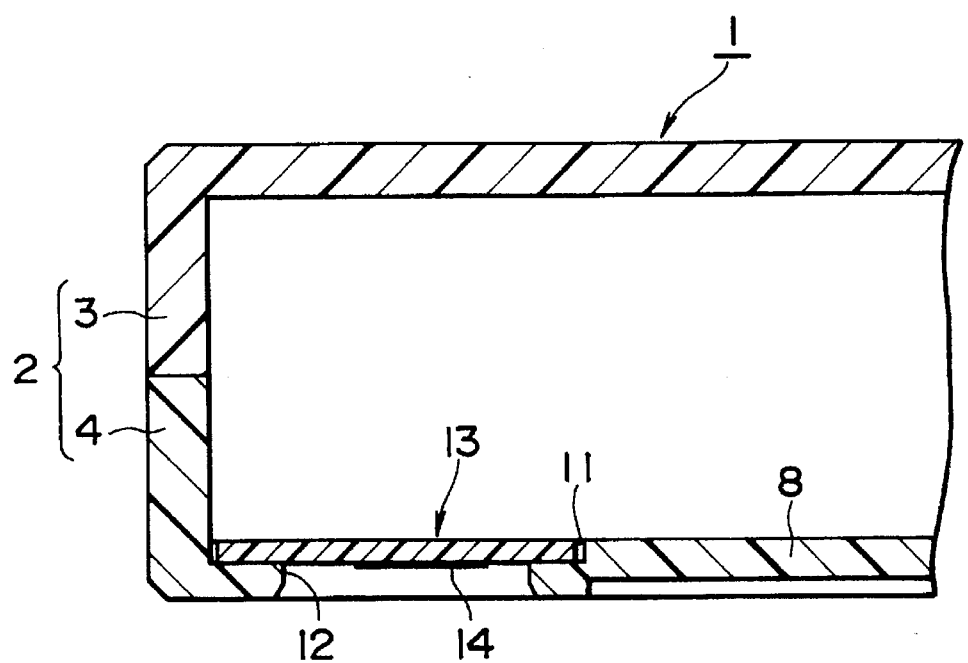
FIG. 3 is an enlarged sectional view of the back portion of a record medium cassette where the printed circuit board not having an IC mounted thereon is disposed within the cassette case according to an embodiment of the present invention.

Such a printed circuit board 13 not having an IC mounted thereon is fixedly fitted into the recess 11 formed in the bottom wall 8 of the cassette case 2 as shown in FIG. 3. More specifically, the printed circuit board 13 is fitted into the recess 11 with the side on which the group of terminals 14 and the conductor pattern 15 are formed facing down and with the contacts 14a to 14d aligning with the slit-like openings 12. The printed circuit board 13 is fixed by means of adhesion or welding.

Figure 4:
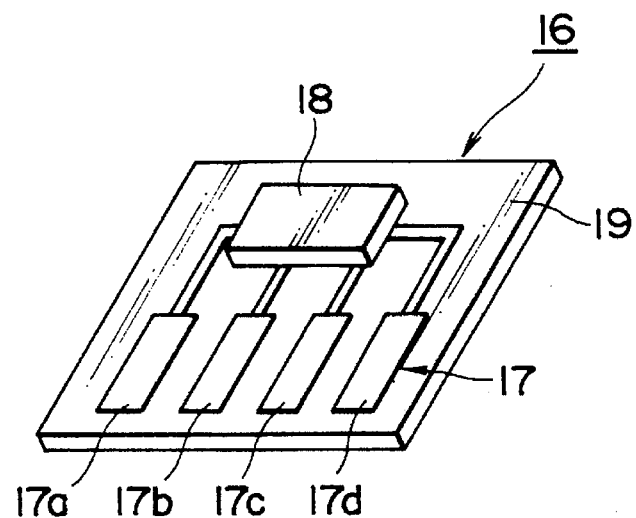
FIG. 4 is a perspective view of a printed circuit board having an IC mounted thereon as detection means according to an embodiment of the present invention.

On the other hand, a printed circuit board 16 having an IC including memory mounted thereon is provided with a group of terminals 17, and the IC 18 as shown in FIG. 4 has a planar shape and size formed in a rectangle such that it is fitted into the recess 11 formed in the bottom wall 8 of the cassette case 2 of the record medium cassette 1, in the same manner as the printed circuit board 13 not having an IC mounted thereon.

The group of terminals 17 on the printed circuit board 16 having an IC mounted thereon are formed of elongated contacts 17a, 17b, 17c, and 17d that are disposed laterally juxtaposed. The spacings of these contacts 17a, 17b, 17c, and 17d correspond to those of the slit-like openings 12 formed in the cassette case 2. The group of contacts 17 may be plated with gold for durability and reliability.

The IC 18 is mounted on a substrate 19 and the IC 18 and the group of terminals 17 are connected by a conductor pattern. For example, the contact 17a is connected with a power supply terminal for the IC 18, the contact 17b is connected with a signal input/output terminal, the contact 17c is connected with a clock terminal, and the contact 17d is connected with a GND terminal.

Figure 5:
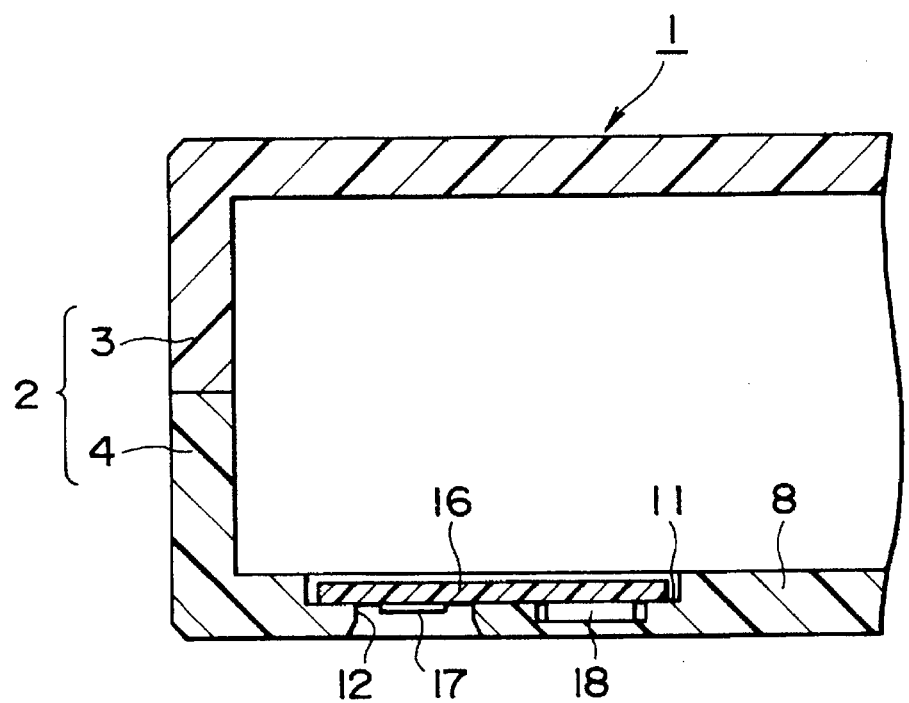
FIG. 5 is an enlarged sectional view of the rear portion of the record medium cassette where the printed circuit board having an IC mounted thereon is disposed in the cassette case according to an embodiment of the present invention.

The described printed circuit board 16 having an IC mounted thereon is fixedly fitted into the recess 11 formed in the bottom wall 8 of the cassette case 2 as shown in FIG. 5. At this time, the printed circuit board 16 having an IC mounted thereon is fitted into the recess 11 with the side on which the group of terminals 17 and the IC 18 are formed facing down and with the contacts 17a to 17d facing the slit-like openings 12. The circuit board 16 is fixed in the recess 11 by means of adhesion or welding.

In order to assure the fixation of the printed circuit board 13 or 16 to the cassette case 2, a presser lip (not shown) vertically hanging from the upper half 3 may be provided so that, when the upper and lower halves 3 and 4 are coupled together, the presser lip presses down the top face of the printed circuit board 13 or 16.

The following describes a recording and reproducing apparatus, in which is set a record medium cassette 1 provided with the group of terminals 14 of the printed circuit board 13 not having an IC mounted thereon as the above-described means to be detected or a cassette provided with the group of terminals 17 of the printed circuit board 16 having such an IC mounted thereon.

Figure 6:
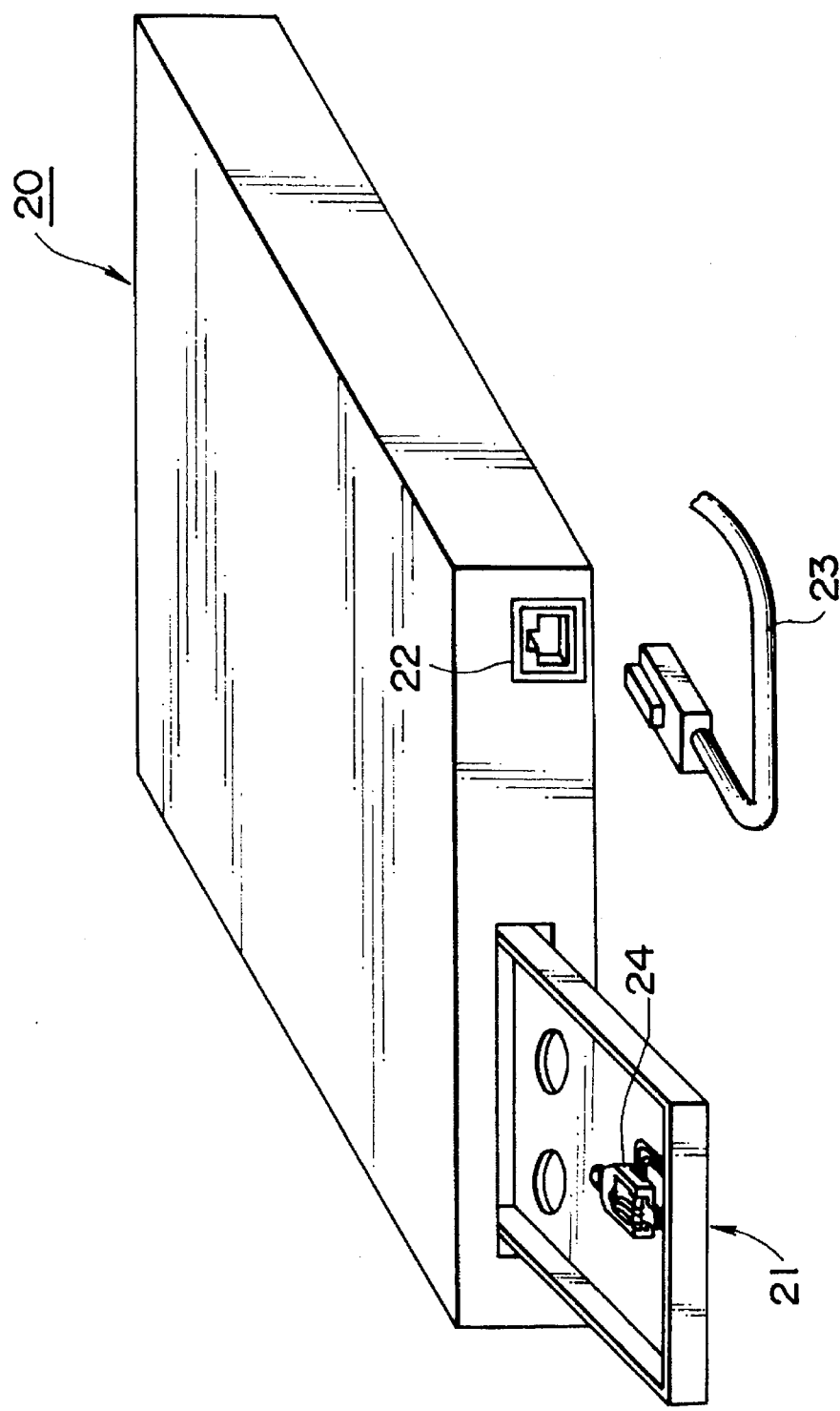
FIG. 6 is an illustration of a recording and reproducing apparatus according to an embodiment of the present invention with its tray drawn out.

The recording and reproducing apparatus 20, as shown in FIG. 6, is provided at one end with a drawable tray 21 for setting a record medium cassette 1 thereon and a communication terminal portion 22 for communicating with another recording and reproducing apparatus or an editing apparatus. The communication terminal portion 22 is structured such that a plug of a communication cable 23 is inserted therein so that the apparatus is connected with another apparatus at the other end of the communication cable 23.

The tray 21 is provided with a connector 24 which, when the record medium cassette 1 is set thereon, comes into contact with the group of terminals 14 or 17 exposed through the slit-like openings 12. When connector 24 comes into contact with the record medium cassette 1, the record medium cassette 1 vertically descends from directly above the connector 24 to come into contact with the same. More specifically, the connector 24 is adapted such that, when the tray 21 of the recording and reproducing apparatus 20 is drawn out for obtaining the record information, the record information in the memory of the printed circuit board 16 having an IC mounted thereon can be obtained by setting the record medium cassette 1 on the tray 21, while it remains drawn out.

Thus, the connector 24 provided on the tray 21 and the group of terminals 14 or 17 of the printed circuit board 13 or 16, respectively, of the record medium cassette 1 can be simply put into contact, without loading the magnetic tape, which is contained in the record medium cassette 1 in a coiled state, into the body of the recording and reproducing apparatus 20.

Accordingly, by setting record medium cassettes on the tray 21 one after another, with the tray 21 kept drawn out, record information can be obtained simply and quickly. The record information can be displayed on a display panel (not shown), which is provided, together with a group of operating devices, on the recording and reproducing apparatus 20, and thereby it is made possible even to obtain the record information that will be obtained when the record medium cassette 1 is loaded in the recording and reproducing apparatus 20 from the record medium cassette 1 just set on the tray 21.

Figure 7:
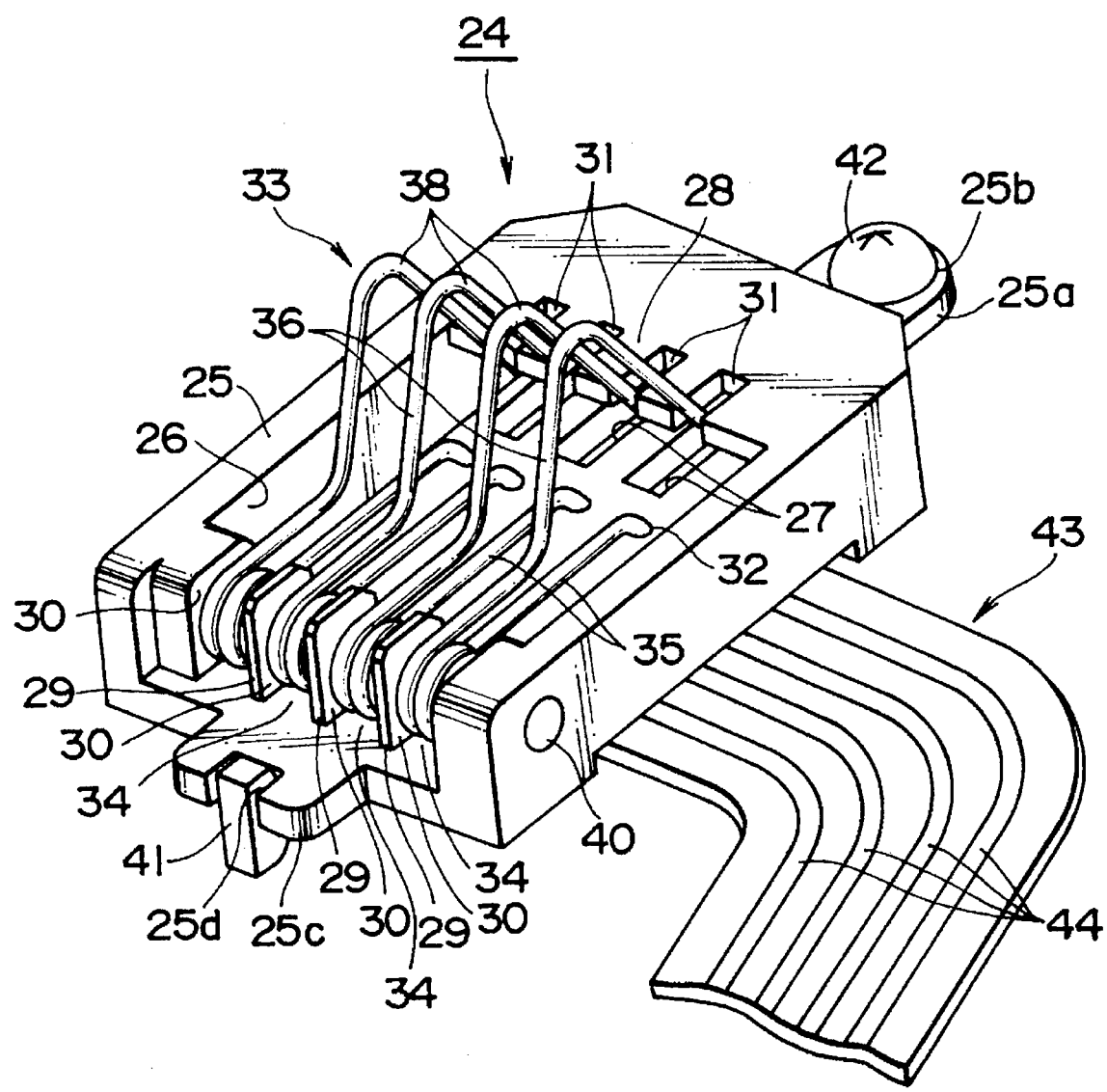
FIG. 7 is an enlarged perspective view of a connector used as connection means for a record medium cassette according to an embodiment of the present invention.
Figure 8:
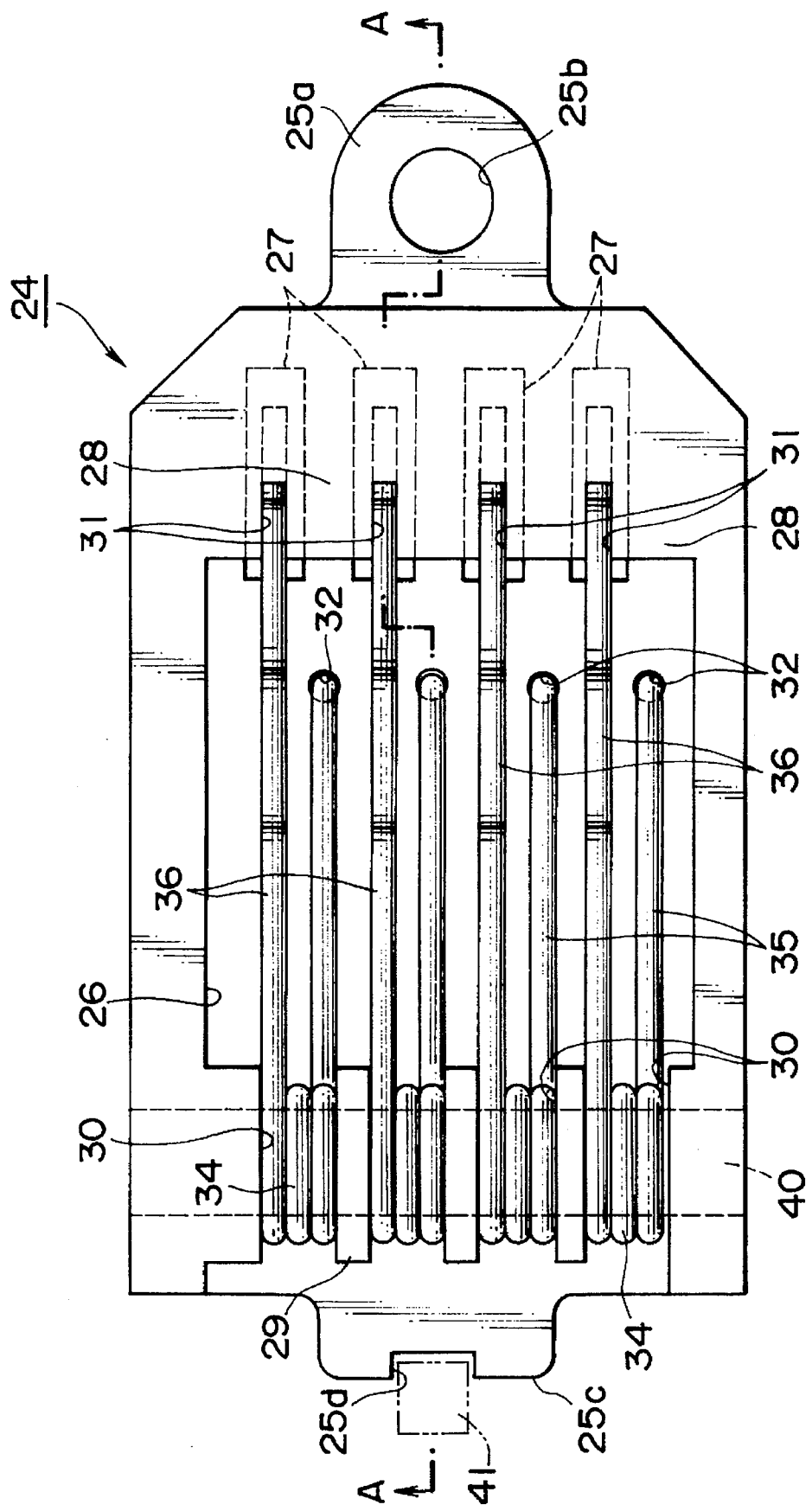
FIG. 8 is a plan view of the connector of FIG. 7.
Figure 9:
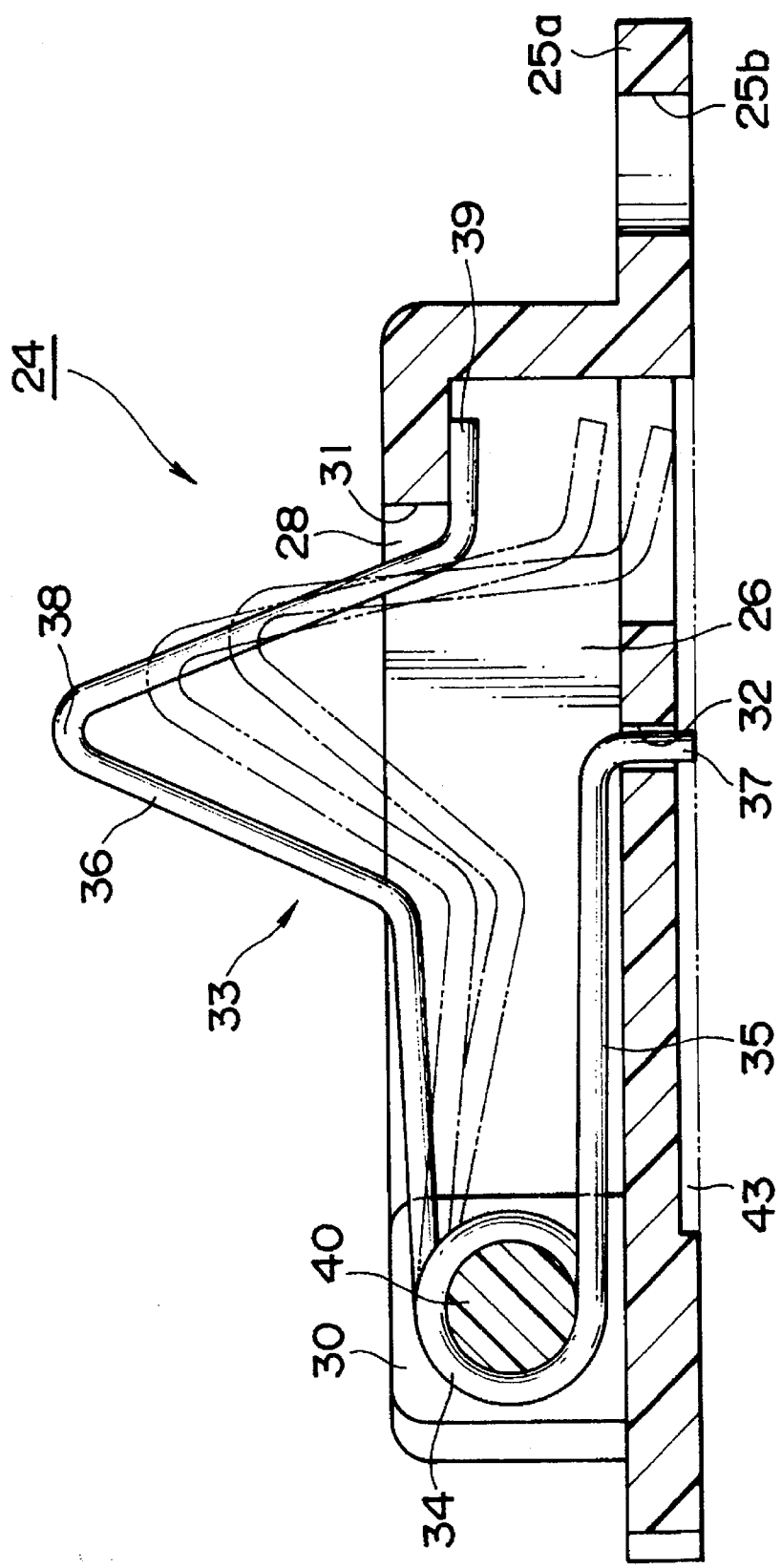
FIG. 9 is a sectional view taken along section line A—A of FIG. 8.

The connector 24 is formed, as shown in FIG. 7 to FIG. 9, of a casing 25 made of insulating materials such as synthetic resin, detection contacts 33, and a support shaft 40 supporting the detection contacts 33 in the casing 25. There is also provided an attaching piece 25a in the position forwardly projected from the center of the lateral side of the front end of the casing 25, and a fastener hole 25b is formed in the attaching piece 25a. On the opposite side of the casing 25, there is provided a second attaching piece 25c that projects from the center of the lateral side of the rear end of the casing 25, and an engagement slot 25d opening rearward is formed in the second attaching piece 25c.

In the top face of the casing 25, there is formed a recess 26, which is open upward and rearward. In a position continuing to the front end of the recess 26 on the top face, there are formed escapement recesses 27. By the formation of the escapement recesses 27, there are formed canopy-like portions 28 in positions continuing to the front end of the recess 26. In a position opposite the canopy-like portions 28, there are provided support walls 29 that are erected toward the rear end of the recess 26 and laterally juxtaposed. Between the support walls 29 and the inner faces of the rear end portions of the recess 26, there are formed support spaces 30 at virtually equal intervals. In the canopy-like portions 28, in the positions opposite to the support spaces 30, there are formed positioning cuttings 31.

At the portion in the middle in the longitudinal direction of the bottom of the recess 26 in the casing 25 and on the lines connecting the support spaces 30 and the canopy-like portions 28, when observed from above, there are formed through holes 32 passing through the casing 25 in the vertical direction.

The detection contact 33 is formed of a conductive wire spring material and is formed into a torsion coil spring, having a pressing spring to provide a preset contacting force and may be plated with gold to keep its contacting quality good. The detection contact 33 formed into a torsion coil spring has a lower piece 35 and an upper piece 36 integrally connected with an intermediate coil portion 34 formed in between. The lower piece 35 has, at its end, a connection piece 37 vertically bent down from the other portion thereof. The upper piece 36 has toward its end a contact portion 38, which is a bent portion in the shape of the inverted letter V projecting upward, and it further has an engagement piece 39 extending horizontally from the end of the contact portion 38.

The detection contact 33 has its intermediate coil portion 34 disposed in the support space 30 of the casing 25, its lower piece 35 except the connection piece 37 disposed along the inner bottom face of the recess 26 in the casing 25, and the connection piece 37 passed through the insertion hole 32 from top to bottom, with the lower end portion downwardly projecting from the outer bottom face of the casing 25.

The front end portion of the contact portion 38 of the upper piece 36 of the detection contact 33 is operatively positioned by the positioning cutting portion 31 for vertical movement and the engagement piece 39 is placed in confronting relationship, from below, with the portion of the lower face of the canopy-like portion 28 in the position in front of the front edge of the positioning cutting 31. When the position of the intermediate coil portion 34 is fixed as described later and when the upper piece 36 is not pressed down, the engagement piece 39 is engaged with the lower face of the canopy-like portion 28 because the upper piece 36 is urged by a biasing force to rotate upward, and thereby the position of the upper piece 36 in the vertical direction is determined.

With the detection contacts 33 disposed in the casing 25 as described above, the support shaft 40 is passed through the rear end portions of the walls defining the left and right ends of the recess 26 in the casing 25, the support walls 29, and the intermediate coil portions 34 of the detection contacts 33. Thus, each of the detection contacts 33 can be supported in the casing 25 in the state as described above.

The casing 25 with the described structure is positioned with the engagement slot 25d of its second attaching piece 25c engaged with an engagement piece 41 erected on the tray 21 of the recording and reproducing apparatus 20 and fixed in place by threading a screw 42 in the fastening hole 25b of the attaching piece 25a from above.

There is provided a flexible wiring substrate 43 for connecting the connector 24 with a microcomputer, not shown. Each conductor of a conductor pattern 44 of the wiring substrate 43 is connected with each contact piece 37 of the detection contacts 33.

Accordingly, if the record medium cassette 1 held in a cassette holder, not shown, of the recording and reproducing apparatus 20 is lowered to the position where the reels 7, 7 are engaged, the top portions of the contact portions 38 of the detection contacts 33 of the connector 24 are brought into contact with the group of terminals 14 or 17 of the record medium cassette 1 and thereby electrical contact is achieved.

At this time, the upper pieces 36 of the detection contacts 33 are pressed by the descending record medium cassette 1 and bent to rotate downward, so that the engagement pieces 39 move down to separate from the lower face of the canopy-like portions 28 of the casing 25 and the top end of the contact portions 38 slightly move forward to come into contact with the group of terminals 14 or 17. Thereby, the top ends of the contact portions 38 are resiliently put into contact with the group of terminals 14 or 17 by the spring force stored up by the above movement.

The following describes a record medium cassette 1A incorporating a printed circuit board 13 not having an IC mounted thereon, a record medium cassette 1B incorporating a printed circuit board 16 having an IC mounted thereon, and a detection circuit provided in a recording and reproducing apparatus 20 provided with the above connector 24 as well as its operation.

Figure 10:
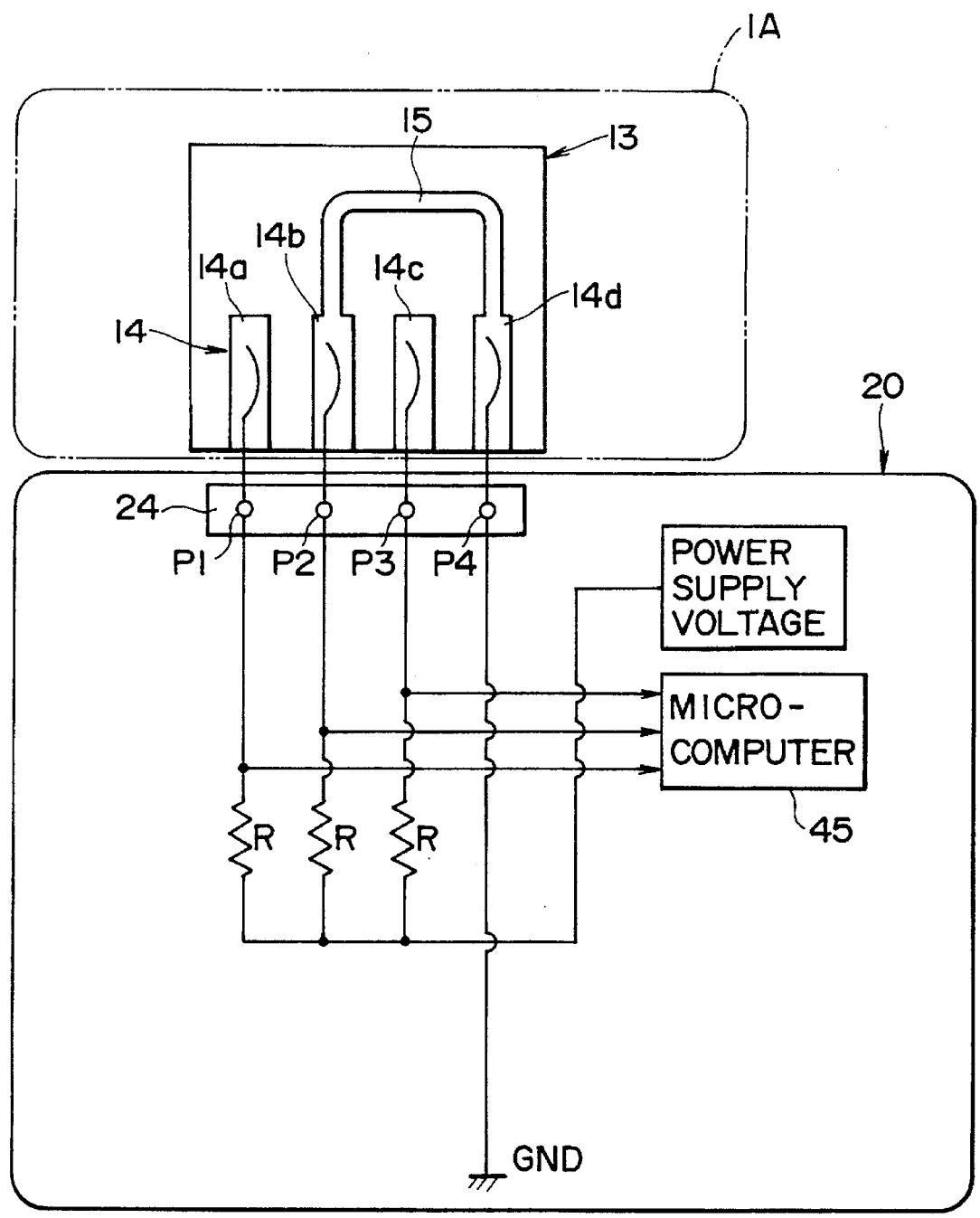
FIG. 10 is a schematic diagram of a printed circuit board not having an IC mounted thereon and incorporated in a record medium cassette.

First, the record medium cassette 1A incorporating a printed circuit board 13 not having an IC mounted thereon, for example, is supplied with a power supply voltage at the contact 14a and a three-bit signal is provided as output from the contacts 14b, 14c, and 14d to a microcomputer 45 as shown in FIG. 10.

In the above described embodiment, the pattern is formed such that only the contact 14a is supplied with the power supply voltage and, in this example, a three-bit signal "0, 1, 0" is obtained. Thus, by suitably forming the connection pattern between the contacts 14b, 14c, and 14d and the contact 14a, eight kinds of three-bit signals, from "0, 0, 0" to "1, 1, 1" can be obtained. From the described arrangement, recognition signals by means of a combination of the electrical connections in the conductor pattern 15 can be provided instead of the generally used recognition holes.

Figure 11:
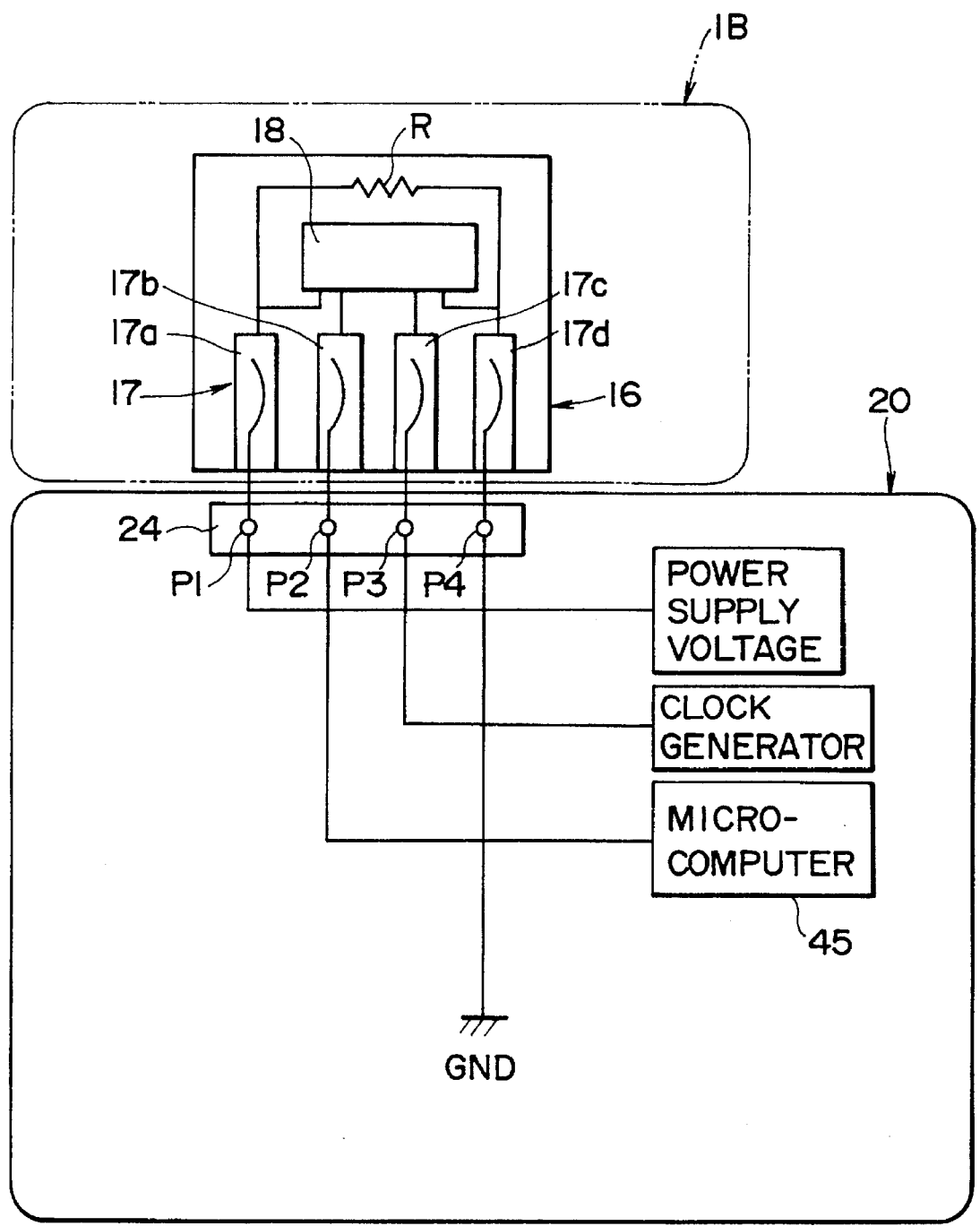
FIG. 11 is a schematic diagram of a printed circuit board having an IC mounted thereon and incorporated in a record medium cassette.

On the other hand, the record medium cassette 1B incorporating a printed circuit board 16 having an IC mounted thereon is formed of a group of terminals 17, the IC 18, and a resistor R as shown in FIG. 11. The group of terminals 17 are formed of a power supply terminal 17a, a data input/output terminal 17b, a clock terminal 17c, and a GND terminal 17d. The power supply terminal 17a is connected with the IC 18 and one end of the resistor R, the clock terminal 17c and the data input/output terminal 17b are connected with the IC 18, and the GND terminal 17d is connected with the IC 18 and the other end of the resistor R.

The IC 18 is formed of a memory and a central processor unit (CPU), not shown. The memory formed of the IC is the so-called ROM/RAM, for recording and storing data, and it functions to record and store data sent over from the CPU and output address data designated by the CPU. The principal function of the CPU is to communicate with the recording and reproducing apparatus 20 and to communicate with the internal memory, and in the communication of data with the recording and reproducing apparatus 20 it uses only the data input/output terminal. The CPU has a rate of data communication of around 1 to 2 MBPS, while its data communicating method is a serial data communicating method. The CPU also has an interface function to read the data in the internal memory and output the data after converting it into a serial data format. Here, the method used in the communication with the internal memory is a parallel data communicating method. This is a general communicating method determined by the ROM/RAM data bus that is employed, and it is used because it is required that the internal processing must be performed at higher speeds.

The CPU operates according to the clock signal received as input through the clock terminal, and the operating speed of the CPU can be controlled by the frequency of the clock signal. Therefore, the transfer rate of data can easily be made greater by increasing the frequency of the clock signal.

Figure 12:
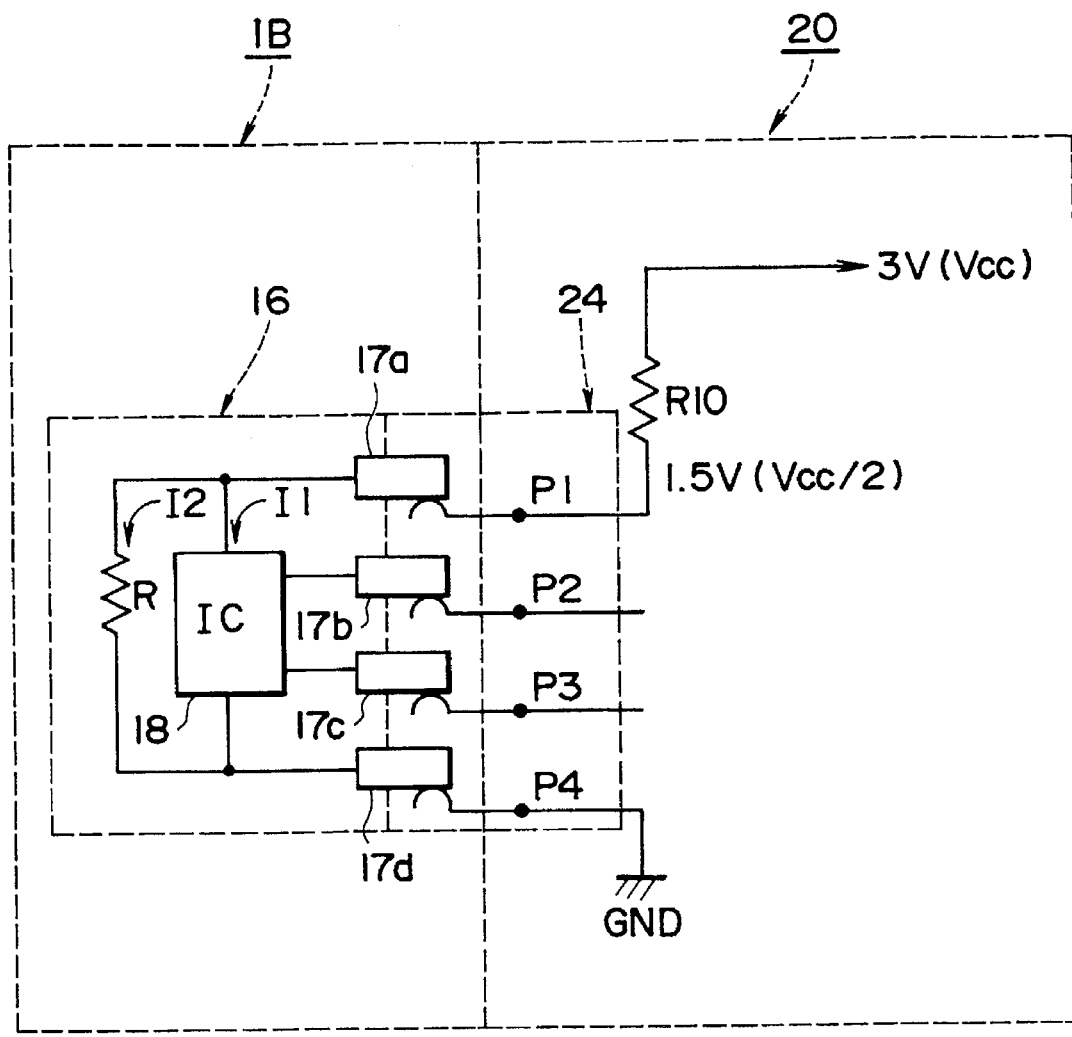
FIG. 12 is a schematic diagram related to the setting of voltage values when a record medium cassette and a recording and reproducing apparatus are in contact.

The resistor R in FIG. 11 determines whether or not the record medium cassette 1 has an IC mounted thereon according to the current flowing through the IC 18 and the resistor R owing to the power supply voltage supplied through the power supply terminal 17a. For example, as shown in FIG. 12, the power supply voltage Vcc supplied from the recording and reproducing apparatus 20 is set to 3 V and one end of a resistor R10 is connected to the power supply voltage Vcc and the other end of it is connected to the terminal P1. On the other hand, the terminal P4 is grounded (GND). The printed circuit board 16 having an IC mounted thereon in connection with the recording and reproducing apparatus 20 has its power supply terminal 17a in contact with the terminal P1 and its GND terminal 17d in contact with the terminal P4 of the recording and reproducing apparatus 20.

Of the current supplied through the power supply terminal 17a, a current I1 flows through the IC 18 and a current I2 flows through the resistor R. In order to limit the current flowing through the IC 18 in the arrangement described above, the potential at the power supply terminal 17a may be decreased to half the power supply voltage Vcc, that is, to approximately 1.5 V. The condition to achieve it is simply obtained from the following expressions, namely, $$(I1+I2) \times R10 = 1.5 \text{ V} \tag{1}$$

$$I2 \times R = 1.5 \text{ V} \tag{2}$$

Here, the value of the current I1 is that predetermined according to the IC 18 in use. For example, in the case where the current I1 =3 mA and if the current I2 is set to 6 mA, the value of the resistor R10 becomes R10 =167Ω from expression (1) and the value of the resistor R =250Ω is obtained from expression (2). In the record medium cassette 1B provided with a printed circuit board 16 having an IC mounted thereon, it is necessary to preset the values of the resistors R and R10 in accordance with the IC 18 and the power supply voltage Vcc of the recording and reproducing apparatus 20.

The following describes the discrimination circuit that discriminates between a record medium cassette 1A provided with the printed circuit board 13 not having an IC mounted thereon and a record medium cassette 1B provided with a printed circuit board 16 having an IC mounted thereon.

Figure 13:
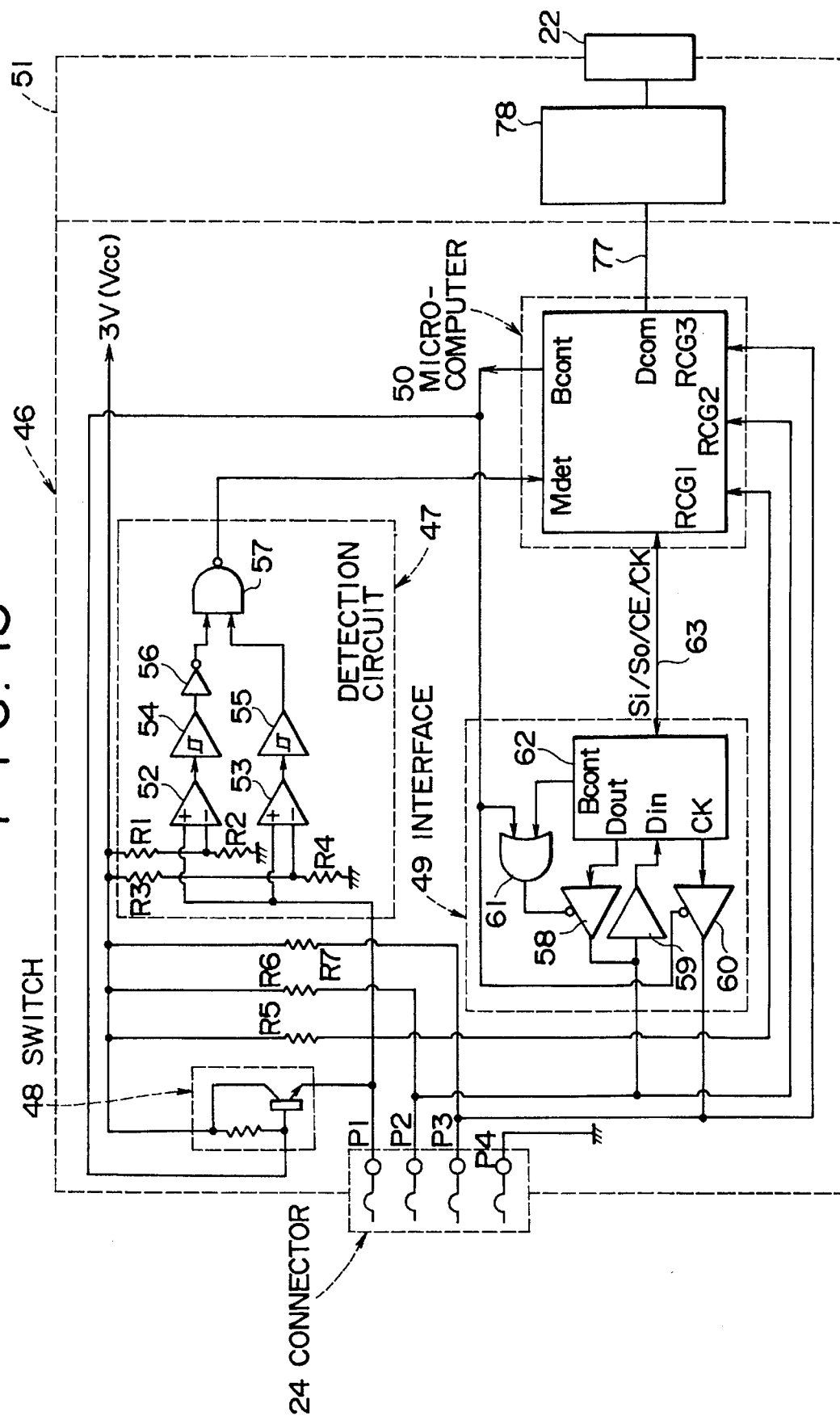
FIG. 13 is a circuit diagram of a discrimination circuit in a recording and reproducing apparatus according to an embodiment of the present invention.

FIG. 13 shows the discrimination circuit 46, which automatically determines through the connector 24 of the recording and reproducing apparatus 20 whether the record medium cassette 1 has an IC mounted thereon and performs transmission and reception of record information. If it identifies a record medium cassette 1 as that having an IC mounted thereon, it can read the record information such as video information from the memory mounted on the IC.

More specifically, the discrimination circuit 46 is formed of a detection circuit 47, resistors R5, R6, and R7, a switch 48, the connector 24, an interface 49, and a microcomputer 50. The connection state of the discrimination circuit 46 is such that, first, the power supply voltage Vcc (3 V) is connected to one end of the resistors R1 and R3 of the detection circuit 47, one end of the resistors R5, R6, and R7, and the collector side of the switch 48. The detection circuit 47 is formed of a comparator 52, a comparator 53, resistors R1, R2, R3, and R4, Schmitt triggers 54 and 55, an inverter 56, and a NAND gate 57. The noninverting input terminal or plus side input terminal of the comparator 52 is connected with the terminal P1 of the connector 24, its inverting input terminal or minus side input terminal is connected with the other end of the resistor R1 and one end of the resistor R2, and its output terminal is connected with the input terminal of the Schmitt trigger 54. The other end of the resistor R2 is connected with GND.

The plus side input terminal of the comparator 53 is connected with the terminal P1 of the connector 24, its minus side input terminal is connected with the other end of the resistor R3 and one end of the resistor R4, and its output terminal is connected with the input terminal of the Schmitt trigger 55. The other end of the resistor R4 is connected with GND. Here, the resistors R1 and R3, and the resistors R2 and R4, have the same resistance values.

The input terminal of the Schmitt trigger 54 is connected with the output terminal of the comparator 52 and its output terminal is connected to the input terminal of the inverter 56. The input terminal of the inverter 56 is connected with the output terminal of the Schmitt trigger 54 and its output terminal is connected to the input terminal of the NAND gate 57.

The input terminal of the Schmitt trigger 55 is connected with the output terminal of the comparator 53 and its output terminal is connected to the input terminal of the NAND gate 57.

The NAND gate 57 is a gate formed of two input terminals and one output terminal. One input terminal is connected with the output terminal of the inverter 56 and the other input terminal is connected with the output terminal of the Schmitt trigger 55 and the output terminal is connected to a memory detection terminal Mdet of the microcomputer 50.

The switch 48 is in the form of the so-called transistor switching device and its collector side is connected with the power supply voltage Vcc, its base side is connected with a bus control terminal Bcont of the microcomputer 50, and its emitter side is connected with the terminal P1 of the connector 24.

The connector 24 is formed of a group of terminals P1, P2, P3, and P4 to be brought into contact with the group of terminals 14 of a record medium cassette 1A incorporating a printed circuit board 13 not having an IC mounted thereon or with the group of terminals 17 of a record medium cassette 1B incorporating a printed circuit board 16 having an IC mounted thereon.

The terminal P1 of the connector 24 is connected with the emitter side of the switch 48, the other end of the resistor R5, and the plus side input terminal of each of the comparator 52 and the comparator 53 of the detection circuit 47. The terminal P2 of the connector 24 is connected with the other end of the resistor R6, the output terminal of a buffer 58 of the interface 49, the input terminal of a buffer 59 of the interface 49, and a terminal RCG2 of the microcomputer 50. The terminal P3 of the connector 24 is connected with the other end of the resistor R7, the output terminal of a buffer 60 of the interface 49, and a terminal RCG3 of the microcomputer 50. The terminal P4 of the connector 24 is grounded (GND).

The interface 49 is formed of the buffers 58, 59, and 60, an OR gate 61, and an interface circuit 62. The OR gate 61 has one input terminal connected with the bus control terminal Bcont of the microcomputer 50, the other input terminal connected with the bus control terminal Bcont of the interface circuit 62, and the output terminal connected with the control terminal of the buffer 58. The buffer 58 has its input terminal connected with a data-out terminal Dout of the interface circuit 62, its output terminal connected with the terminal P2 of the connector 24, and its control terminal connected with the output terminal of the OR gate 61. The buffer 59 has its input terminal connected with the output terminal of the buffer 58 and the terminal P2 of the connector 24, and has its output terminal connected with a data-in terminal Din of the interface circuit 62. The buffer 60 has its input terminal connected with a clock terminal CK of the interface circuit 62, its output terminal connected with the terminal P3 of the connector 24 and a recognition terminal RCG3 of the microcomputer 50, and its control terminal connected with the bus control terminal Bcont of the microcomputer 50.

The interface circuit 62 has its bus control terminal Bcont connected with one input terminal of the OR gate 61, its data-out terminal Dout connected with the input terminal of the buffer 58, its data-in terminal Din connected with the output terminal of the buffer 59, and its clock terminal CK connected with the input terminal of the buffer 60, of which the output terminal is connected with the data input terminal Si/So/CE/CK of the microcomputer 50.

The microcomputer 50 has its bus control terminal Bcont connected with the base side of the switch 48, and the other input terminal of the OR gate 61, and the control terminal of the buffer 60 of the interface 49. The microcomputer 50 has a memory detection terminal Mdet connected with the output terminal of the NAND gate 57, and its input terminal Si/So/CE/CK connected with the output terminal of the interface 49, its recognition terminal RCG1 connected with the terminal P1 of the connector 24, its recognition terminal RCG2 connected with the terminal P2 of the connector 24, and its recognition terminal RCG3 connected with the terminal P3 of the connector 24. A digital communication output terminal Dcom of the microcomputer 50 transmits stored information in the record medium cassette 1B to another apparatus and is connected to an interface 78 of the control unit 51 within the recording and reproducing apparatus 20. The control unit 51 will be described below.

If a record medium cassette 1A incorporating a printed circuit board 13 not having an IC mounted thereon or a record medium cassette 1B incorporating a printed circuit board 16 having an IC mounted thereon is set in the recording and reproducing apparatus 20 provided with the discrimination circuit 46 structured as above, the record information in each of the record medium cassettes 1A and 1B can be obtained.

First, when the record medium cassette 1 is set in the recording and reproducing apparatus 20, the discrimination circuit 46 determines whether the record medium cassette 1 has an IC mounted thereon. This determination is made upon the setting of the record medium cassette 1 in the recording and reproducing apparatus 20 by detecting a change in the voltage value as described above relative to FIG. 12. More specifically, the voltage at the connector 24 of the discrimination circuit 46 is either 0 V or 3 V when the record medium cassette 1 is that provided with a printed circuit board 13 not having an IC mounted thereon, whereas it is approximately half (1.5 V) the power supply voltage Vcc (3 V) when the record medium cassette 1 is that provided with a printed circuit board 16 having an IC mounted thereon. The voltage value at the connector 24 is that determined by the resistor R described with reference to FIG. 12 and the resistors R5, R6, and R7 of the discrimination circuit 46.

The following describes (1) the method of dubbing record information in the case where the record medium cassette 1A is that incorporating a printed circuit board 13 not having an IC mounted thereon and (2) the method of dubbing record information in the case where the record medium cassette 1B is that incorporating a printed circuit board 16 having an IC mounted thereon.

(1) The dubbing method in the case where the record medium cassette 1A is that incorporating a printed circuit board 13 not having an IC mounted thereon:

When a record medium cassette 1A incorporating a printed circuit board 13 not having an IC mounted thereon is set in the recording and reproducing apparatus 20, the recognition output terminal 14a of the printed circuit board 13, described in FIG. 10, is in physical contact with the terminal P1 of the connector 24 of the discrimination circuit 46, and similarly the recognition output terminal 14b is in physical contact with the terminal P2 of the connector 24, the recognition terminal 14c is in physical contact with the terminal P3 of the connector 24, and the recognition output terminal 14d is in physical contact with the terminal P4 of the connector 24.

At this time, because the recognition output terminal 14a is in an open state and the switch 48 is in an off state, the potential of the terminal P1 of the connector 24 becomes equal to the potential of the power supply voltage Vcc (3 V), and, if the recognition output terminal 14c is connected with GND, the potential of the terminal P1 of the connector 24 becomes virtually 0 V. The potential 3 V or 0 V of the terminal P1 of the connector 24 is fed into the plus side input terminals of the comparator 52 and the comparator 53. When the potential at the plus side input terminals is 3 V, the comparator 52 and the comparator 53 operate to produce a high level signal at the output terminal. However, in such a state, the input condition for the NAND gate 57 is not satisfied.

On the other hand, when the potentials at the plus side input terminals of the comparator 52 and the comparator 53 are both virtually 0 V, a low level signal is produced from the output terminals of the comparator 52 and the comparator 53. Also, in this state, the input condition for the NAND gate 57 is not satisfied. The condition under which the input condition for the NAND gate 57 is satisfied is that the signal at the output terminal of the comparator 52 is at a low level and the signal at the output terminal of the comparator 53 is at a high level. More specifically, while the minus side input terminals are supplied with voltages of the power supply voltage divided by resistors R1, R2, R3, and R4 (R1=R3, R2=R4), the resistance values of these resistors are so set that the comparator 52 does not operate, but the comparator 53 operates, when the potential at the terminal P1 of the connector 24 is approximately 1.5 V.

Accordingly, when the potential at the terminal P1 of the connector 24 is approximately 3 V or 0 V, the input condition for the NAND gate 57 is not satisfied and, hence, the signal at its output terminal remains at a high level. Therefore, a signal at a high level is transmitted to the memory detection terminal Mdet of the microcomputer 50.

When the signal at the memory detection terminal Mdet is at a high level, the signal at the bus control terminal Bcont remains at a low level, whereby the circuit operation in the interface 49 is inhibited and, since the switch 48 is not turned on, the power supply voltage Vcc is not supplied to the terminal P1 of the connector 24.

Instead, a signal at the recognition output terminal 14a of the printed circuit board 13 shown in FIG. 10 is fed into the recognition terminal RCG1 of the microcomputer 50 connected through the terminal P1 of the connector 24, a signal at the recognition output terminal 14b is fed into the recognition terminal RCG2 of the microcomputer 50 connected through the terminal P2 of the connector 24, and a signal at the recognition output terminal 14c is fed into the recognition terminal RCG3 of the microcomputer 50 connected through the terminal P3 of the connector 24, and, from such recognition signals supplied thereto, the microcomputer 50 can obtain record information from the record medium cassette 1.

Namely, from the input recognition signals it can obtain such information as the type and thickness of the magnetic tape in the record medium cassette 1 and suitably display the information, or can communicate it as record information to another apparatus.

(2) The dubbing method of record information in the case where the record medium cassette 1B is that incorporating a printed circuit board 16 having an IC mounted thereon:

When a record medium cassette 1B incorporating a printed circuit board 16 having an IC mounted thereon is set in the recording and reproducing apparatus 20, the power supply voltage terminal 17a of the printed circuit board 16, described in FIG. 11, is in physical contact with the terminal P1 of the connector 24 of the discrimination circuit 46, and, similarly, the data input/output terminal 17b is in physical contact with the terminal P2 of the connector 24, the clock terminal 17c is in physical contact with the terminal P3 of the connector 24, and the GND terminal 17d is in physical contact with the terminal P4 of the connector 24.

Here, the power supply terminal 17a is connected with the GND terminal 17d in connection with GND through the IC 18 as described in FIG. 11, and the resistor R, and the resistance value, together with the resistance R of the printed circuit board 16, is preset such that a voltage value of approximately 1.5 V, which is half the value of the power supply voltage Vcc, is generated at the terminal P1 of the connector 24 through the resistor R5 when it is connected with the discrimination circuit 46.

Therefore, when the discrimination circuit 46 and the record medium cassette 1B incorporating a printed circuit board 16 having an IC mounted thereon come into contact, a voltage of approximately 1.5 V is generated at the terminal P1 of the connector 24 and this voltage value 1.5 V is supplied to the plus side input terminals of the comparators 52 and 53 of the discrimination circuit 46, so that a low level signal is produced at the output terminal of the comparator 52 and a high level signal is produced at the output terminal of the comparator 53, and thereby the input condition of the NAND gate 57 is satisfied and the signal at the memory detection terminal Mdet of the microcomputer 50 is a low level signal.

When the signal at the memory detection terminal Mdet is low, the microcomputer 50 produces a high level signal at the bus control terminal Bcont to turn on the switch 48 and supply the power supply voltage Vcc (3 V) to the terminal P1 of the connector 24. The supply of approximately 3 V of voltage to the terminal P1 of the connector 24 supplies the power supply voltage Vcc (3 V) to the IC 18 of the printed circuit board 16, which is connected with the connector 24, so that the IC 18 is rendered operative. At the same time, as the signal at the bus control terminal Bcont becomes high, the buffer 58, through the OR gate 61 of the interface 49, and the buffer 60 are made able to input and output signals, so that for example the clock signal is sent from the clock terminal CK of the interface circuit 62 to the terminal P3 of the connector 24 through the buffer 60.

The clock signal from the terminal P3 is sent to the IC 18 of the printed circuit board 16 and, in accordance with this clock signal, signal transmission and reception between the record medium cassette 1 and the recording and reproducing apparatus 20 is made possible. More specifically, the microcomputer 50 of the discrimination circuit 46 instructs the IC 18 of the printed circuit board 16 of the record medium cassette 1B through the interface 49 to send data and this data comes in through the terminal P2 of the connector 24.

Accordingly, by simply putting the plurality of terminals of the record medium cassette 1 into contact with the connector 24 of the recording and reproducing apparatus 20, it is automatically determined whether the cassette is a record medium cassette having an IC mounted thereon, and it is made possible to obtain the record information and suitably display the contents, or use the same as communication data for transmission to another apparatus.

When it is desired to record data in the IC 18 of the printed circuit board 16 incorporated in the record medium cassette 1B, the microcomputer 50 of the discrimination circuit 46 can transmit an instruction to execute the recording of the data through the interface 49.

As a practical application, if the record medium cassette 1 is that having a printed circuit board 16 with an IC 18 already having recorded data, reading of the data recorded in the IC 18 is started, and thereby it is determined, for example, that the record medium cassette 1 is a cassette for rental or it is a pre-recorded cassette.

When the cassette does not yet have recorded data, it is possible to determine the length of the cassette tape, the remaining playing time, or the like, by reading the data in the IC 18, or to record the total time of video recording which has just been done, the remaining playing time, the date and the time of day of the video recording, and the like in preset order.

The microcomputer 50 having obtained record information from the record medium cassette 1 set in the recording and reproducing apparatus 20 and having stored it therein can, under instruction of the control unit 51, communicate the data to another apparatus through the interface and the communication terminal portion 22. The microcomputer 50 can further receive record information from another apparatus to store it therein or transmit it therefrom. The related operations will be described below.

The memory of the IC 18 mounted on the record medium cassette 1 is capable of storing two types of data: the contents of the recorded video, and record information pertaining to specific properties of the particular tape. The dubbing method of the present invention discloses means for easily copying both types of data from the record medium cassette 1 set in the recording and reproducing apparatus 20 to a second recording and reproducing apparatus, or for receiving such data therefrom.

Figure 14:
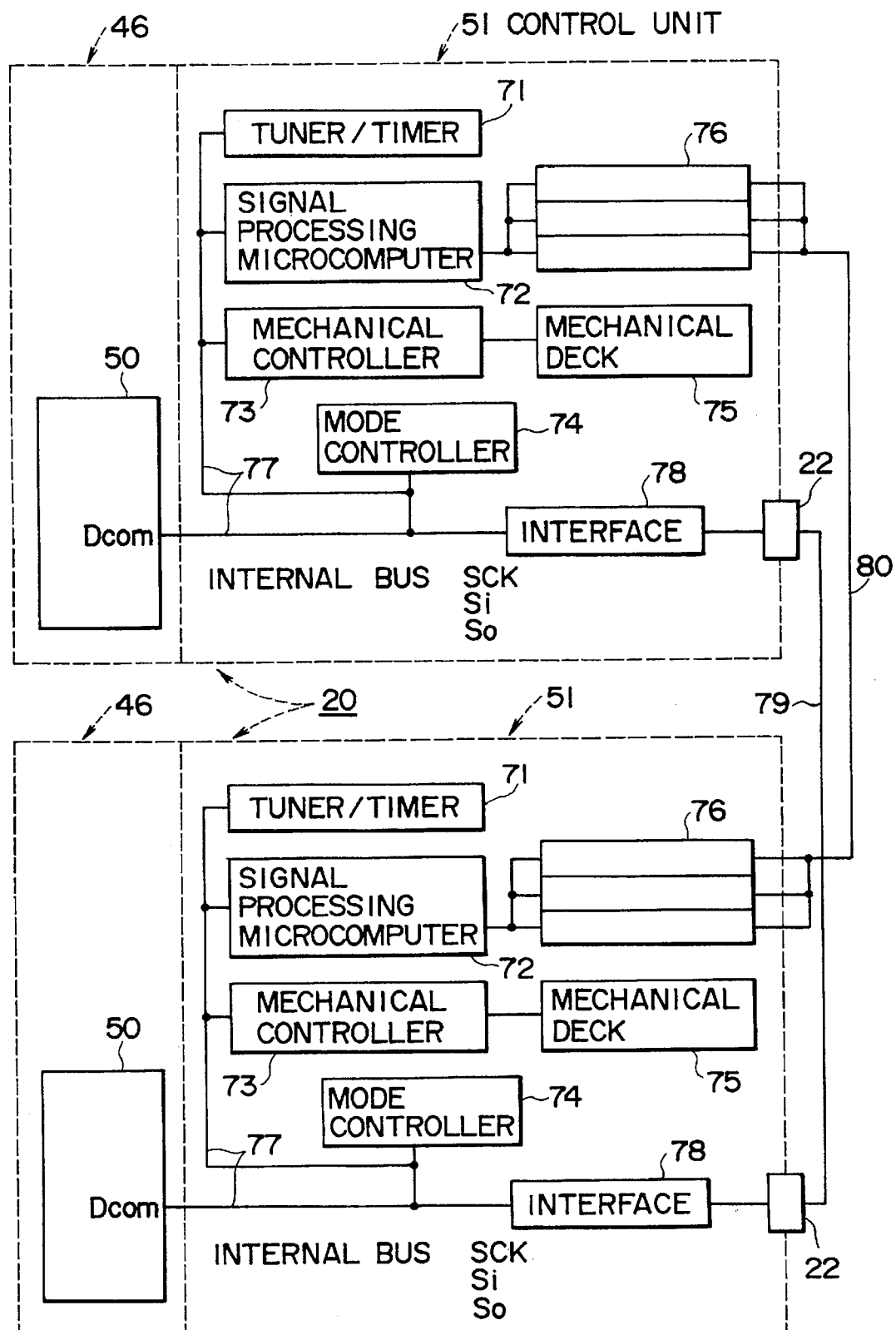
FIG. 14 is a block diagram of recording and reproducing units provided with communication means according to an embodiment of the present invention in a state of connection with each other through a memory data communication bus and an FIG. 15 is a block diagram of recording and reproducing units provided with communication means according to an embodiment of the present invention in a state of connection with each other through a single communication line.

In the first embodiment as shown in FIG. 14, the content data of the recorded video is communicated through an audio/video cable 80, and the record data is communicated through a communication bus 79. FIG. 14 shows two recording and reproducing units 20 connected by a communication cable 79 and an audio/video cable 80, in which each unit 20 includes a discrimination circuit 46, including a microcomputer 50, and a control unit 51, as shown in FIG. 13. Since both units are of the same structure, their corresponding components are denoted by corresponding reference numerals, and since the discrimination circuit 46 has already been described with reference to FIG. 13, description of the same will be omitted.

In the control unit 51, a tuner/timer 71, a signal processing microcomputer 72, a mechanical controller 73, a mode controller 74, and an interface 78 are interconnected through an internal bus line 77. The internal bus 77 is further connected with the digital communication terminal Dcom of the microcomputer 50 in the discrimination circuit 46. The tuner/timer 71 executes time management, such as suitable selection of signals that are sent over to the signal processing microcomputer 72, and specification of a group of circuits to tune with respect to their carrier frequency and to the tuning period.

The signal processing microcomputer 72, composed of a plurality of peripheral ICs 76 performing special processes, performs processing of signals selected by the tuner/timer 71, which signals are processed into audio and video data comprising the contents of the recorded video. The content data is then transmitted through the audio/video cable 80 to other units connected therewith. Similarly, content data from other units is received through the audio/video cable 80.

The mechanical controller 73 connected with a mechanical deck 75 controls mechanical operations such as loading the tape of the record medium cassette 1. The mode controller 74, controls modes such as recording, reproduction, and rapid feeding. The interface 78 accepts signals for transmitting and receiving record information to and from other units connected therewith through the communication terminal portion 22.

The record information of the record medium cassette 1 stored in the microcomputer 50 of the discrimination circuit 46 in the described arrangement can be transmitted, through the control units 51, to another apparatus, or received from another apparatus, connected therewith. More specifically, the microcomputer 50 of the discrimination circuit 46 reads the record information in the record medium cassette 1 set therein and, when transmitting the read information to another apparatus, transmits it through a communication bus 79, or receives it therethrough from another apparatus. The communication bus 79 performs transmission and reception of data in accordance with control signals such as SCK/Si/So signals.

During transmission, the microcomputer 50 transmits the record information together with a control signal from the digital communication terminal Dcom through the internal bus 77. The stored information is sent to the interface 78 and transmitted to another apparatus through the communication terminal portion 22. The content data is similarly transmitted to another apparatus through the audio/video cable 80.

On the other hand, during reception, just as during transmission, stored information, together with a control signal, is sent over from another apparatus through the communication terminal portion 22 and the interface 78. By receiving the control signal and the stored signal through the interface 78, the record information sent over from another apparatus can be accepted. Similarly, content data is sent from another apparatus through the audio/video cable 80.

Figure 15:
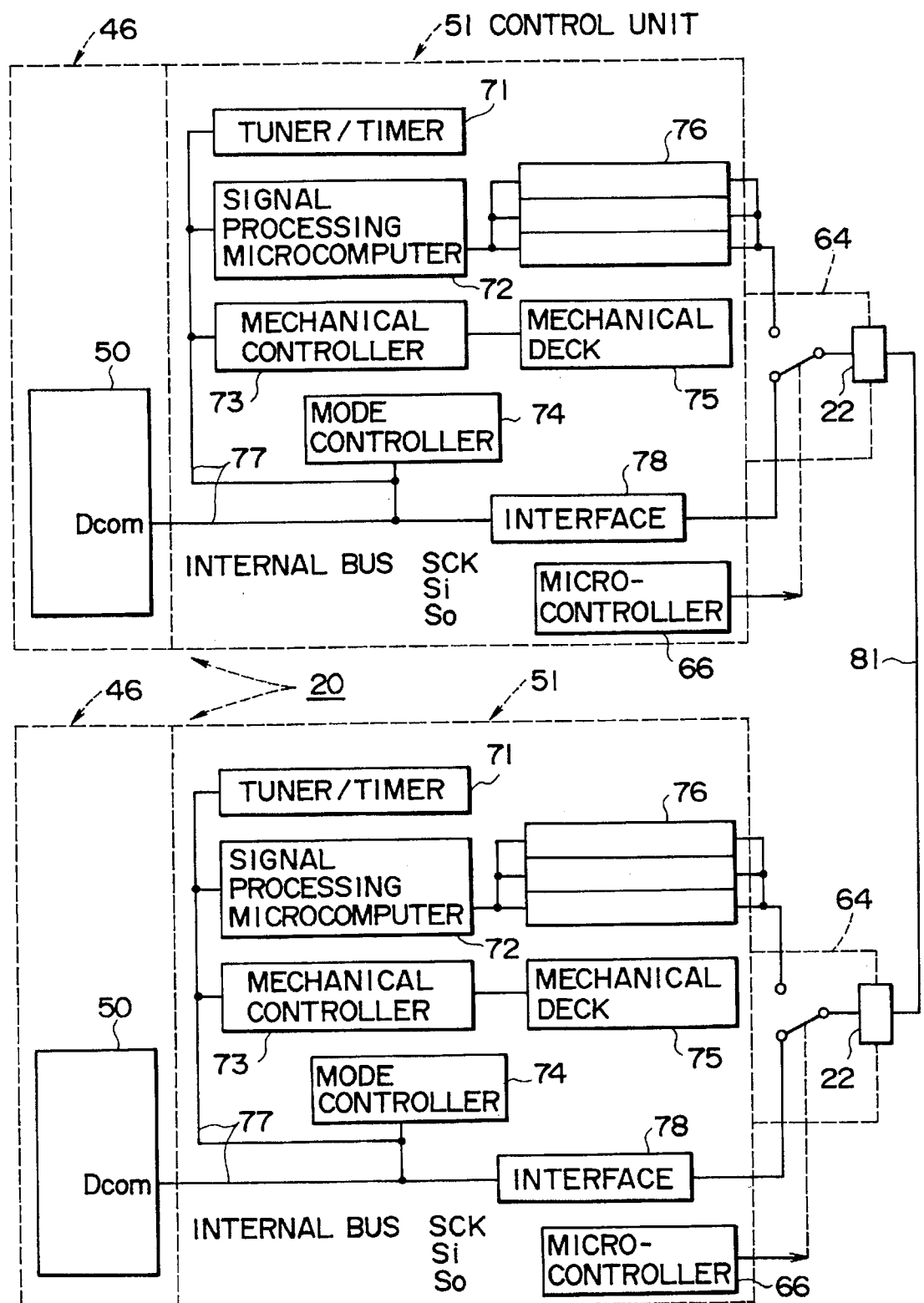
Figure 16:
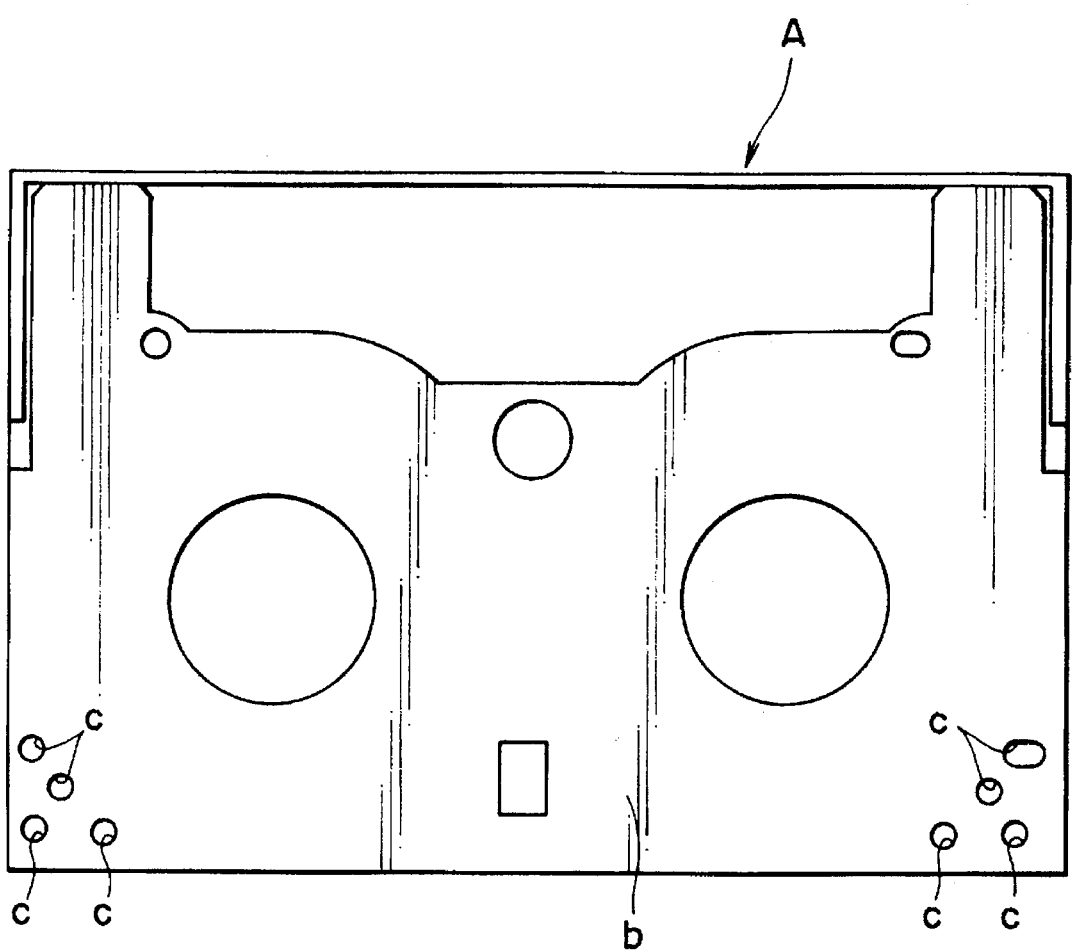
FIG. 16 is a diagram of the rear side of a cassette showing recognition holes in the conventional art.

In the second embodiment as shown in FIG. 15, both the content data and the record data are communicated to another apparatus through a single communication bus 81. FIG. 15 shows two recording and reproducing units 20 connected by a single communication bus 81 and respective switch units 64, and in which each unit is that formed of a discrimination circuit 46, including a microcomputer 50 and a control unit 51 as shown in FIG. 13. The control unit 51 is composed and operates as described above with reference to FIG. 14, except that the memory data transmitted from the interface 78 and the audio/video data are alternately transmitted over the single bus 81 by using respective switch units 64 under control of internal microcontrollers 66.

The micro-controller 66 controls the respective switching unit 64 such that first the memory data from the IC is copied into the other IC and then the switch 64 is activated and the audio/video data is transmitted over the single bus 81 and recorded.

Further, during dubbing, if control information of an apparatus on the slave side is stored in the memory of the IC of the record medium cassette set in the apparatus on the master side, control of the apparatus on the slave side can be executed by the apparatus on the master side.

In the recording and reproducing apparatus 20 for a record medium cassette 1 according to the present invention, as described in the foregoing, such information as record information, that is, contents of the video record, type, thickness, length, and the like, of the magnetic tape, information as to whether the cassette is that already recorded, that for rental, and the like, can be simply communicated to another apparatus by only putting the plurality of terminals 14 or 17 of the record medium cassette 1 into contact with the connector 24 of the recording and reproducing apparatus 20, without the need for loading the magnetic tape coiled inside the record medium cassette 1. Such an excellent effect can be obtained that editing, dubbing, and the like, of record medium Cassettes can be performed very quickly and easily. Further, since communication between recording and reproducing units 20 is made possible through utilization of a communication bus 79 and an audio/video cable 80 or through utilization of a single communication bus 81, such an excellent effect can also be obtained that the arrangement for transmission and reception of information between units 20 in connection can be simply made.

Having described specific preferred embodiments of the present invention with reference to the accompanying drawings, it is to be understood that the invention is not limited to those precise embodiments, and that various changes and modifications may be effected therein by one skilled in the art without departing from the spirit or the scope of the present invention as defined in the appended claims.

What is claimed is:

1. A recording and reproducing apparatus for a record medium cassette including a circuit board with a memory and a group of electrical terminals fixed thereto, comprising:

a housing;

connection means for making electrical contact with the electrical terminals of the record medium cassette when the record medium cassette is set in the apparatus;

read means connected to said connection means for reading out information stored in said memory of the set record medium cassette and providing said information at the electrical terminals of the set record medium cassette;

communication means connected to said read means for communicating the information read out by said read means to a second recording and reproducing apparatus, wherein said communication means performs said communication through a communication terminal disposed in an outer surface of said housing, said communication terminal being attached to a bus line for connecting the first and second recording and reproducing apparatuses; and a tray slidably supported by said housing for longitudinal movement from a position within said housing to a position outside of said housing for setting the record medium cassette thereon, wherein said connection means is attached to said tray to be movable with said tray.

2. A recording and reproducing apparatus for a record medium cassette according to claim 1, wherein said connection means is comprised of:

a casing for attachment to said tray;

a plurality of electrically conductive detection contacts, wherein each detection contact is formed into a torsion coil spring pivotally supported by said casing and includes a contact portion for contact with the electrical terminals of the record medium cassette;

a plurality of holes formed through the bottom surface of said casing for receiving end portions of said detection contacts, whereby, when the record medium cassette is set on the tray, the electrical terminals of the record medium cassette come into contact with the contact portions of said detection contacts causing the rotation thereof such that the end portions thereof pass through said plurality of holes and protrude from the bottom surface of said casing for contact with said read means.

3. A recording and reproducing apparatus for a record medium cassette including a circuit board with a memory and a group of electrical terminals fixed thereto, comprising:

a housing;

connection means for making electrical contact with the electrical terminals of the record medium cassette when the record medium cassette is set in the apparatus;

read means connected to said connection means for reading out information stored in said memory of the set record medium cassette and providing said information at the electrical terminals of the set record medium cassette;

communication means connected to said read means for communicating the information read out by said read means to a second recording and reproducing apparatus; and a tray slidably supported by said housing for longitudinal movement from a position within said housing to a position outside of said housing for setting the record medium cassette thereon, wherein said connection means is attached to said tray to be moved with said tray.

4. A recording and reproducing apparatus for a record medium cassette according to claim 3, wherein said connection means is comprised of:

a casing for attachment to said tray;

a plurality of electrically conductive detection contacts, wherein each detection contact is formed into a torsion coil spring pivotally supported by said casing and includes a contact portion for contact with the electrical terminals of the record medium cassette;

a plurality of holes formed through the bottom surface of said casing for receiving end portions of said detection contacts, whereby, when the record medium cassette is set on the tray, the electrical terminals of the record medium cassette come into contact with the contact portions of said detection contacts causing through said plurality of holes and protrude from the bottom surface of said casing for contact with said read means.

5. A recording reproducing apparatus for a record medium cassette according to claim 3, wherein said read means comprises a first microcomputer and said communication means comprises a second microcomputer.

6. A method for communicating record and content data, contained in a memory of a record medium cassette, between a first recording and reproducing apparatus having a housing and a second recording and reproducing apparatus, comprising:

provVidinges the first recording and reproducing apparatus with a tray slidably supported by the housing for longitudinal movement from a position within the housing to a position outside of the housing;

setting the record medium cassette on the tray of the first recording and reproducing apparatus when the tray is in the position outside the housing, whereby a plurality of electrical terminals on the record medium cassette come into electrical contact with a plurality of contact portions of a connector mounted in the tray of the first recording and reproducing apparatus;

applying a power supply voltage to the connector;

detecting the voltage across the terminals of the connector to determine whether the record medium cassette has a memory;

transferring the record and content data from the record medium cassette to a first microcomputer;

transferring the record and content data from the first microcomputer to a control unit wherein the record data is transferred to an interface and the content data is transferred to a processing computer; and transferring the output of said interface and said processing computer to the second recording and reproducing apparatus by use of a second microcomputer.

7. A method for communicating record and content data as defined in claim 6, wherein the record data is transferred through a bus line and the content data is transferred through an audio/visual line.

8. A method for communicating record and content data as defined in claim 6, wherein the record data is transferred from said interface to a switching unit and the content data is transferred from said processing computer to said switching unit controlled by a micro-controller to transfer the record data through a communication bus to said second recording and reproducing apparatus first, and thereafter, the switching unit actuates to transfer the content data through said communication bus to said second recording and reproducing apparatus.

* * * * *